(12) United States Patent
Liu et al.

(10) Patent No.: US 8,816,699 B2
(45) Date of Patent: Aug. 26, 2014

(54) VOLTAGE SOURCE FOR CALIBRATING A FAST TRANSIENT VOLTAGE MEASUREMENT SYSTEM AND CALIBRATION METHOD

(75) Inventors: Weidong Liu, Beijing (CN); Weijiang Chen, Beijing (CN); Shaowu Wang, Beijing (CN); Gongchang Yue, Beijing (CN); Chengyu Wang, Beijing (CN); Zhibing Li, Beijing (CN)

(73) Assignees: Tsinghua University, Beijing (CN); State Grid Corporation of China, Beijing (CN); China Electric Power Research Institute, Beijing (CN)

( * ) Notice: Subject to any disclaimer, the term of this patent is extended or adjusted under 35 U.S.C. 154(b) by 422 days.

(21) Appl. No.: 13/206,683

(22) Filed: Aug. 10, 2011

(65) Prior Publication Data

US 2012/0032686 A1 Feb. 9, 2012

(30) Foreign Application Priority Data

Feb. 23, 2010 (CN) .......................... 2010 1 0113277

(51) Int. Cl.
*G01R 35/00* (2006.01)
*G01R 31/12* (2006.01)
*G01R 15/16* (2006.01)

(52) U.S. Cl.
CPC .......... *G01R 35/007* (2013.01); *G01R 31/1254* (2013.01); *G01R 15/16* (2013.01)

USPC ........................... 324/601; 324/509; 324/522

(58) Field of Classification Search
USPC ......................................... 324/509, 601, 522
See application file for complete search history.

(56) References Cited

U.S. PATENT DOCUMENTS 5,933,012 A * 8/1999 Bengtsson et al. ............ 324/524

* cited by examiner

*Primary Examiner* — Vincent Q Nguyen
(74) *Attorney, Agent, or Firm* — Christensen O'Connor Johnson Kindness PLLC

(57) ABSTRACT

The present disclosure discloses a voltage source for calibrating a very fast transient voltage measurement system, comprising a DC high voltage power supply, a discharging gap, a high voltage travelling wave line concluding a high voltage conductor and an earthing conductor. The present disclosure also provides a method for calibrating a fast transient voltage measurement system: the high voltage conductor is insulated from the earthing conductor, and is open circuit at one end and at the other end is connected with the earthing conductor via the discharging gap, applying a high voltage between the high voltage conductor and earthing conductor and making breakdown of the discharging gap, a very fast transient high voltage is produced on the high voltage conductor and its waveform can be determined by theoretical calculation, the very fast transient high voltage with known waveform is used as the calibration voltage for calibrating the measurement system.

3 Claims, 2 Drawing Sheets

Vertical coordinate: Voltage, 20mV/div20ns/div;
Horizontal coordinate: Time, 20ns/div

VOLTAGE SOURCE FOR CALIBRATING A FAST TRANSIENT VOLTAGE MEASUREMENT SYSTEM AND CALIBRATION METHOD

The present application claims the benefit of Chinese Patent Application No. 201010113277.7, filed on Feb. 23, 2010 with the Chinese Patent Office and entitled "A Device and Method for Producing A Calibration Voltage", which is incorporated herein by reference in its entirety.

TECHNICAL FIELD

The present disclosure relates to high voltage field, more specifically, to a voltage source for calibrating a fast transient voltage measurement system and calibration method.

TECHNICAL BACKGROUND

In the high voltage research and application field, it is often concerned of very fast transient high voltage, in which the voltage amplitude can be up to several million volts, the voltage rising time is within a range of several nanoseconds and the frequency can be up to decades of MHz. It makes an important and practical sense to exactly measure very fast transient high voltage.

For example, in electric power system, Gas Insulation Switchgears (GIS) are used in large quantities, the operation of GIS is concerned the problem of very fast transient high voltage. It is described in the following with reference to FIG. 1: three sections of central conductors 11a, 11b and 11c of GIS busbar are supported with the insulators 13 within the metal housing 12, and the movable contacts 14a and 14b of the switches can protrude into and retract from the central conductors 11a and 11c, so as to complete the closing or opening operation between the central conductors. When the central conductor 11a is connected with a power-frequency power supply, the movable contact 14b is in an open state and the movable contact 14a is in a operating process, there might appears such a phenomena in which there appears a high voltage at the gap between the central conductor 11a and 11b so that the gap is broken down and very fast transient high voltage is produced at the busbar, the amplitude of which might far and away exceed the rated voltage of the equipment, so it is called very fast transient over-voltage (VFTO). VFTO severely endangers the insulations of the substation equipment. It is necessary to exactly measure the waveform of VFTO when researching and solving the problem of VFTO.

Conventional methods for measuring VFTO use resistance voltage divider or capacitive voltage divider etc. In the following is explained a method for measuring VFTO of the capacitive voltage divider in GIS. As shown in FIG. 1, when measuring VFTO at position of measurement point 15 on busbar, a measurement system consisted of a capacitive voltage divider 16 and a measurement device 17 is used. Said capacitive voltage divider 16 has a structure as shown in FIG. 2, a hand hole 21 is made in the housing 12 of the GIS corresponding to the position of measurement point, an inductive electrode 22 is fixed in the hand hole 21, the inductive electrode 22 and the GIS housing 12 are insulated from each other, and the stray capacitance between the inductive electrode 22 and the high voltage busbar 11b forms the high voltage arm of the capacitive voltage divider 16, the stray capacitance between the inductive electrode 22 and the GIS housing 12 forms the low voltage arm of the capacitive voltage divider 16, and voltage of the low voltage arm is inputted into the measurement device 17 via cable 24.

The capacitive voltage divider 16 converts the very fast transient high voltage to a low voltage signal satisfying the requirement of the measurement device 17 such as an oscilloscope. In order to ensure exact measurement of very fast transient high voltage, it is required to calibrate exactly the frequency response characteristic and the voltage dividing ratio of the measurement system. A typical parameter for describing the frequency response characteristic of the measurement system is "rising time of step response", that is, the time in which the system response changes from the lower voltage level to the higher voltage level when the system is excited under a step voltage. The rising time of step response describes the response speed and measurement capability of the measurement system to a fast transient voltage; the voltage dividing ratio is the ratio of the practical very fast transient high voltage to the converted low voltage; and the calibration means assigning a certain parameter value to the calibrated measurement system, herein assigning the value of the rising time of step response and the voltage dividing ratio to the measurement system.

The measurement system consists of the capacitive voltage divider 16 and the measurement device 17, its frequency response characteristic and voltage dividing ratio can be calibrated via experiments, the process is: applying a very fast transient high voltage of a known waveform at a measurement point of the busbar, comparing the known waveform and the waveform measured by the calibrated measurement system; and determining the frequency response characteristic and the voltage dividing ratio of the calibrated measurement system. The very fast transient high voltage of known waveform is the calibration voltage. For the exact calibration, the calibration voltage requires a waveform not only having enough high rising gradient of wave front, but also having enough high voltage amplitude, so that the output of the measurement system has enough high signal amplitude and signal-to-noise ratio.

Prior art provides a calibration method: providing a high voltage steep pulse generator which outputs a calibration voltage with the voltage rising time in the range of several ns; measuring the calibration voltage simultaneously with an existing measurement system satisfying the measurement accuracy requirement and the calibrated measurement system; making comparison between the measurement results of the two measurement systems and determining the frequency response characteristic and voltage dividing ratio the calibrated measurement system.

Prior art also provides a calibration method: providing a high voltage steep pulse generator which outputs a calibration voltage with known waveform and amplitude, of which the voltage rising time is in the range of several ns; the high voltage steep pulse generator is connected to the measurement point via a transition connector, and outputs impulses to act upon the calibrated measurement system; in order to keep the voltage waveform of the measurement point the same as the voltage waveform of the calibration source, the reflection of impulses in the transition connector must be avoided, therefore, the transition connector must be well transited and matched in wave impedance.

In the above calibration methods in the prior art, it is necessary to use a high voltage steep pulse generator, and to measure the calibration voltage using an existing measurement system satisfying the measurement accuracy requirement, and also to complicatedly match in wave impedance, so the system is of complicated structure and the measurement process is very cumbersome.

SUMMARY OF INVENTION

In view of this, the present disclosure provides a voltage source with simple structure for calibrating a fast transient voltage measurement system and a calibration method using the voltage source to complete the calibration, the technical solution is as below.

The voltage source for calibrating a fast transient voltage measurement system of the present disclosure comprising: a DC high voltage power supply, a discharging gap, a high voltage conductor and an earthing conductor, wherein the high voltage conductor and the earthing conductor are high voltage insulated from each other and form a traveling wave line with constant wave impedance; the DC high voltage power supply is connected between the ends of the high voltage conductor and the earthing conductor, for charging DC high voltage between the high voltage conductor and the earthing conductor;

the discharging gap is connected between the ends of the high voltage conductor and the earthing conductor; the discharging gap is broken down when the DC voltage between the high voltage conductor and the earthing conductor is risen to a certain amplitude.

Preferably, the voltage source further comprises a charging resistor connected between the DC high voltage power supply and the end of the high voltage conductor.

Preferably, the DC high voltage power supply is connected with the same end of the high voltage conductor as the discharging gap.

Preferably, the DC high voltage power supply is connected with the different end of the high voltage conductor from the discharging gap, respectively.

Preferably, the high voltage conductor is the central conductor of the Gas Insulated Switchgear (GIS) busbar.

Preferably, the earthing conductor is the metal earthing housing of the Gas Insulated Switchgear (GIS) busbar.

The present disclosure also provides a method for calibrating a fast transient voltage measurement system, using the above voltage source for calibrating the fast transient voltage measurement system, comprising:

a charging step, including: starting the DC high voltage power supply to charge DC high voltage between the high voltage conductor and the earthing conductor;

a breaking down step, including:

increasing the charging voltage between the high voltage conductor and the earthing conductor to a certain amplitude so that the discharging gap connected at the end of the high voltage conductor is broken down; and after the discharging gap being broken down, producing a very fast transient high voltage on the high voltage conductor; wherein the waveforms of very fast transient high voltages at positions on the high voltage conductor can be obtained theoretically; the very fast transient high voltage is used as the calibration voltage.

The method of calibrating the measurement system comprising:

measuring the charging voltage between the high voltage conductor and the earthing conductor connected with the discharging gap, recording the voltage at which the discharging gap being broken down; selecting a measurement point on the high voltage conductor, wherein the measurement point can be selected at the end of the high voltage conductor opposite to the discharging gap, where the very fast transient high voltage has a waveform theoretically of a series of squares and the amplitude of the squares as large as double of the breakdown voltage of the discharging gap; measuring the voltage waveform of the measurement point by the measurement system to be calibrated; and reading out the front rising time and the voltage amplitude of the first square wave.

calibrating the frequency response characteristic and the voltage dividing ratio of the measurement system, wherein, the front rising time reading out from the first square wave is calibrated as the rising time of step response which the measurement system at least reaches;

double of the measured breakdown voltage of the discharging gap is the practical amplitude of the square wave voltage appeared at the measurement point, the ratio of the practical amplitude of the square wave voltage to the measured amplitude of the square wave is calibrated as the voltage dividing ratio of the measurement system.

Preferably, the measurement point is selected at any point on the high voltage conductor, and the waveform of the very fast transient high voltage appeared at the measurement point can be obtained theoretically.

It can be known from the above technical solution that, compared to the prior art, in the present disclosure, a section of traveling wave line with constant wave impedance is formed by using a high voltage conductor and an earthing conductor; the high voltage conductor is of open circuit at one end and at the other end is connected to earth via a discharging gap; applying a high voltage between the high voltage conductor and the earthing conductor to break down the discharging gap, a very fast transient high voltage is produced on the high voltage conductor, the waveform of the very fast transient high voltage can be determined by theoretical calculation; the very fast transient high voltage is used as the calibration voltage for calibrating the very fast transient high voltage measurement system. The present disclosure prevents from using a high voltage steep pulse generator and complicated matching in wave impedance, also prevents from using an existing measurement system satisfying measurement accuracy requirement. It is simplified in structure of the voltage source as well as the calibration method.

BRIEF DESCRIPTION OF DRAWINGS

In order to more clearly describe the embodiments of the present disclosure or the technical solutions of prior art, simple explanations will be made in the following for the drawings used in the description of the embodiments or the prior art. It is obvious that the drawings described in the following just show some embodiments of the present disclosure and for one skilled in the art, he can obtain other drawings on the basis of these drawings, without exercising inventive skills

DETAILED DESCRIPTION OF THE EMBODIMENTS

The following will clearly and completely describe the technical solutions of the embodiments of the present disclosure in connection with the drawings of the embodiments of the present disclosure. It is obvious that the described embodiments are just a portion of, but not all of embodiments of the present disclosure. Based on the embodiments in the present disclosure, the person skilled in the art can obtain other embodiments without exercising inventive skills, all of the other embodiments fall within the protection scope of the present disclosure.

The existing methods for calibrating a measurement system all need to use a high voltage steep pulse generator, and need to use an existing measurement system to measure the waveform of the high voltage steep pulse, and also need to make a complicated wave impedance match, so the system is of complicated structure and the measurement process is very cumbersome.

In order to solve the above problem, the present disclosure provides a voltage source for calibrating a fast transient voltage measurement system, comprising a high voltage DC power supply, a discharging gap, an internal high voltage conductor and an external earthing conductor; and also provides a method for producing a calibration voltage: by applying a DC high voltage between a section of the high voltage conductor with high voltage insulation and the earthing conductor, the high voltage conductor is of open circuit at one end and at the other end connected with the earthing conductor via the discharging gap. A very fast transient high voltage is produced on the high voltage conductor and its waveform can be determined by theoretical calculation, the very fast transient high voltage with known waveform is used as the calibration voltage for calibrating the measurement system. This reaches the purpose of simplifying the structure of voltage source for calibrating the fast transient voltage measurement system as well as the calibration method.

For better understanding the technical solution of the present disclosure for the person skilled in the art, the following will further describe the present disclosure in detail in connection with the specific embodiments.

Embodiment 1

Figure 1:
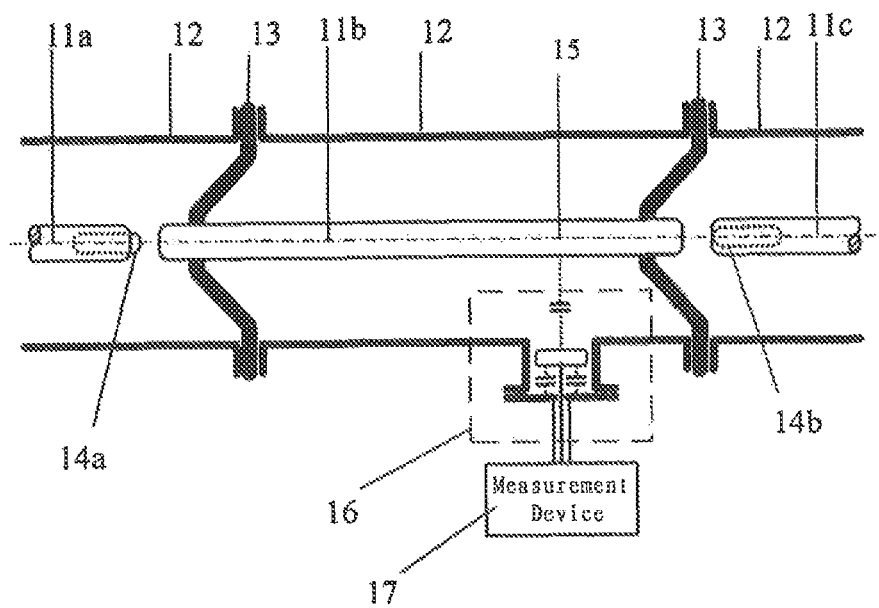
FIG. 1 is a schematic view showing the structure of busbar of the GIS (gas insulated switchgear)
Figure 2:
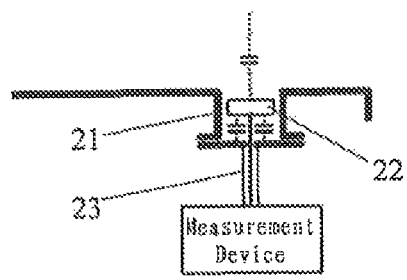
FIG. 2 is a schematic view showing the structure of the capacitive voltage divider.
Figure 3:
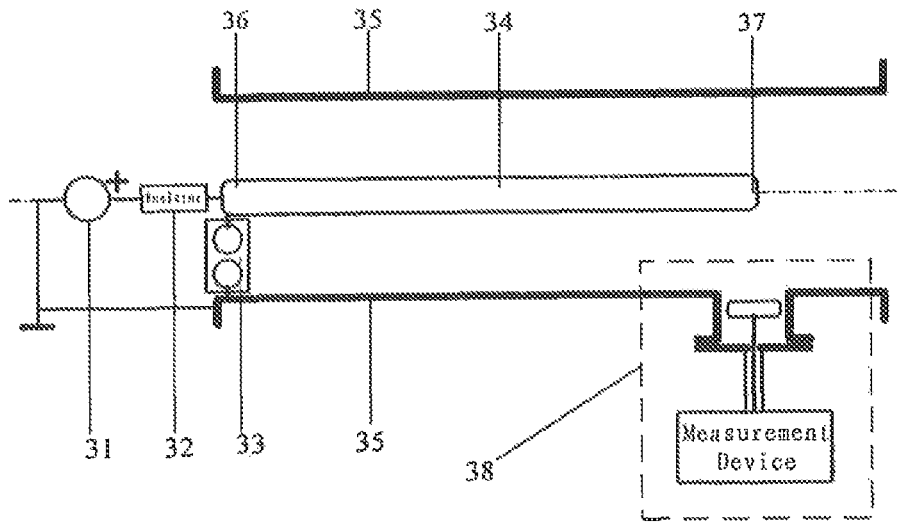
FIG. 3 is a schematic view showing the structure of the voltage source for calibrating a fast transient voltage measurement system according to the first embodiment of the present disclosure.

As shown in FIG. 3, the present disclosure provides a voltage source for calibrating a fast transient voltage measurement system, comprising a DC high voltage power supply 31, a charging resistor 32, a discharging gap 33, a central conductor 34 and a metal earthing housing 35.

In this embodiment, the central conductor 34 is an internal high voltage conductor, and the metal earthing housing 35 is an external earthing conductor.

The DC high voltage power supply 31 is connected with one end 36 of the central conductor 34 of GIS busbar via the charging resistor 32, the discharging gap 33 is connected between one end 36 of the central conductor 34 and the earthing housing 35, a capacitive voltage divider based measurement system 38 to be calibrated is located at the other end of the central conductor and carries out measurement on a measurement point 37 of the central conductor.

Wherein the DC high voltage power supply 31 can output a voltage of 0-100 kV, the length of the central conductor 34 is typically 1500 mm, and the discharging gap 33 is filled with the gas $SF_6$ with high insulation strength.

With the above voltage source to calibrate the capacitive voltage divider based measurement system 38, the present disclosure provides a method for calibrating as below:

Firstly, carrying out a charging process including: starting the DC high voltage 31 to charge the central conductor 34 via the charging resistor 32.

Then, carrying out a breakdown process, including:

With the increasing of the charging voltage between the central conductor 34 and the metal housing 35, a high voltage appears on the discharging gap 33, and causes breakdown of the gap when the voltage reaches certain amplitude. After the discharging gap 33 is broken down, one end 36 of the central conductor is made short circuit to the metal earthing housing 35 via the discharging gap 33, and the other end 37 of the central conductor is open circuit.

Simultaneously, the voltage at one end 36 of the central conductor is measured by a voltmeter, the voltage value of the voltmeter increases during the charging process, and when the discharging gap 33 is broken down, the breakdown voltage was measured to be 7 kV; The breakdown of the discharging gap 33 produced a high voltage fast transient which is measured by the measurement system 38 at the measurement point 37 and has the waveform shown in FIG. 4 as the section after point A. The following explains the forming principle of this section of waveform.

At the moment when the discharging gap 33 is broken down at the voltage of 7 kV, the end 36 of the central conductor is made short circuit to the metal housing 35, there is formed a traveling wave reflecting back and forth on the central conductor 34, in which there is a negative full reflection of the traveling wave at the end 36 of the central conductor due to the short circuit and there is a positive full reflection of the traveling wave at the other end 37 of the central conductor due to the open circuit; in an ideal condition, namely, the section of conductors has a uniform wave impedance and has no loss, and the breakdown of the discharging gap has an ideal switching characteristic, the voltage produced at the other end 37 of the central conductor is a periodic square wave. The ideal condition is practically impossible, the loss of the conductors causes attenuation of the traveling wave during the propagation, and the time spending on the breakdown of the discharging gap 33 also causes the step to rise in its front edge with certain rising time, nevertheless, since the central conductor 34 has enough homogenous wave impedance and the discharging gap 33 has enough high performance, the first step of the voltage waveform produced by the breakdown of the discharging gap 33 is still approximately close to the idea one.

Figure 4:
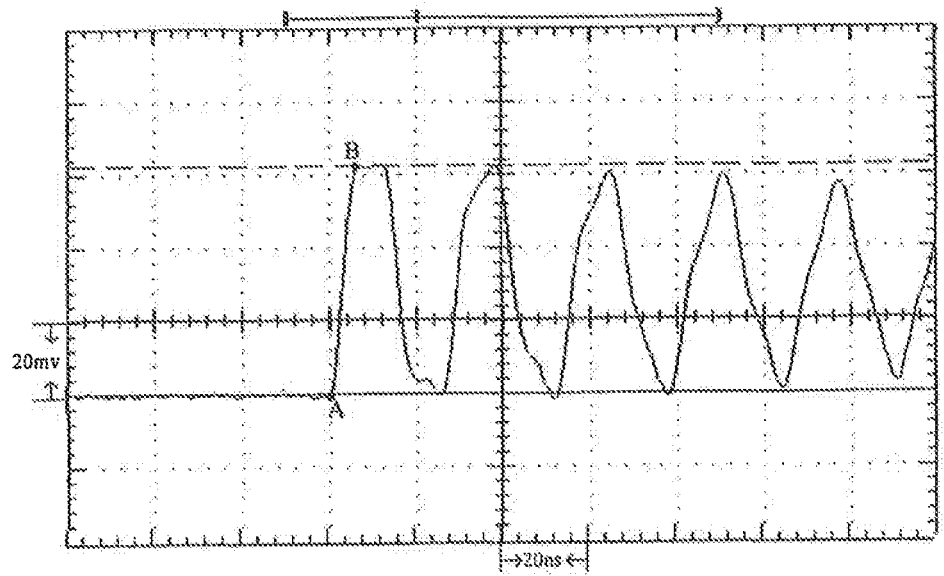
FIG. 4 is a view showing the waveform measured by a capacitive voltage divider based measurement system according to the first embodiment of the present disclosure.

Finally, carrying out a calibration process:

Calibration of the frequency response characteristic of the capacitive voltage divider based measurement system 38: according to the waveform pattern shown in FIG. 4, reading out the rising time of the first step, namely the time difference between the point B and the point A of the first step, it can be calculated that the rising time of the first step is 6 ns. Thus, the step response rising time which the measurement system at least reaches is calibrated as 6 ns.

Calibration of the voltage dividing ratio of the capacitive voltage divider based measurement system 38: since the traveling wave takes a positive full reflection at the open circuit end of the central conductor and here the voltage amplitude of two traveling wave overlay after reflection is double of the recorded discharging gap breakdown voltage 7 kV, i.e., 14 kV. According to the wave pattern shown in FIG. 4, reading out the voltage amplitude of the first step, namely the voltage difference between the point B and the point A of the first step, it can be calculated that the voltage amplitude of the first step is 63 mV.

The voltage dividing ratio is the ratio of the practical amplitude of the very fast transient high voltage produced at the right end of the central conductor to the voltage amplitude, namely the voltage dividing ratio=14 kV/63 mV=14000V/0.063V=222222.22. Thus, the voltage dividing ratio of this measurement system is calibrated as 222222.22.

It should be indicated that the specific number and value concerned in the embodiments of the present disclosure are just for illustration, and should be note construed as limitation to the technical solution of the present disclosure.

Embodiment 2

Figure 5:
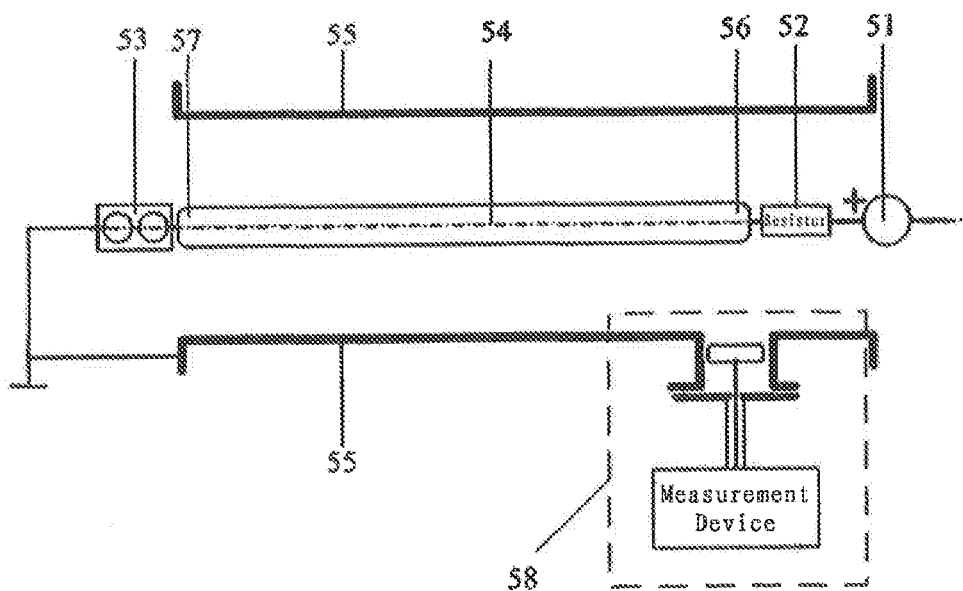
FIG. 5 is a schematic view showing the structure of the voltage source for calibrating a fast transient voltage measurement system according to the second embodiment of the present disclosure.

As shown in FIG. 5, the present disclosure provides another voltage source for producing a calibration voltage, comprising a DC high voltage power supply 51, a charging resistor 52, a discharging gap 53, a central conductor 54 and an external earthing conductor 55.

The DC high voltage power supply 51 is connected via the charging resistor 52 between the central conductor 54 and the earthing conductor 55 at the end 56 of the central conductor 54, the discharging gap 53 is connected between the central conductor 54 and the earthing conductor 55 at the other end 57 of the central conductor 54 a capacitive voltage divider based measurement system 58 to be calibrated is located at the end 56 of the central conductor. The very fast transient high voltage transient produced at the end 56 is used as the calibration voltage.

This embodiment differs from the first embodiment in that, in the first embodiment, the discharging gap and the DC high voltage power supply are connected to the same end of the central conductor, and in the present embodiment, the discharging gap and the DC high voltage power supply are connected to the different ends of the central conductor. The voltage source provided in the first and the second embodiments can bring about the same application effects.

The method for producing a calibration voltage and the calibration method in this embodiment are similar to those in the first embodiment, and thus no more detailed description thereto is made herein. The key point is: the resistance of the charging resistor 52 is much larger than the wave impedance of the central conductor 54, producing positive full reflection of traveling wave at the end 56.

It should be noted that in the above embodiments, the measurement system to be calibrated has the measurement point located at one end of the central conductor, opposite to the discharging gap. The measurement point can also be selected at other position of the central conductor, and the waveform of the very fast transient high voltage of the measurement point can be determined by theoretical calculation.

Also, it should be noted that in the above embodiments, the high voltage conductor and the earthing conductor are designed as two conductors with a coaxial structure, and the high voltage conductor and the earthing conductor can also be designed as a traveling wave line structure in other forms such as two conductors of parallel flat plates.

In addition, it should be noted that in the above embodiments, the measurement system is a capacitive voltage divider based measurement system, which can also be other measurement system for measuring the very fast transient high voltage.

In the above embodiments, by applying a high voltage between the central conductor and the metal earthing housing, the central conductor is of open circuit at one end and at the other end connected with the metal earthing housing via the discharging gap. A very fast transient high voltage is produced on the central conductor and its waveform can be determined by theoretical calculation, the very fast transient high voltage with known waveform is used as the calibration voltage for calibrating the measurement system. This reaches the purpose of simplifying the structure of voltage source for calibrating the fast transient voltage measurement system as well as the calibration method.

In the above embodiments, each embodiment is described in its own important points, and as for some points in one embodiment which are not described in detail in this embodiment, reference can be made to related description of other embodiment. The above description of the embodiments enables one skilled in the art to achieve or apply the present disclosure. Various modifications of these embodiments are obvious for one skilled in the art, and the general principle defined in this text can be realized in other embodiments without departing from the spirit and scope of the present disclosure. Thus, the present disclosure is not limited to those embodiments described in this text, but should accord with a broadest scope that is consistent with the principle and the novel feature disclosed in this text.

The invention claimed is:

1. A method for calibrating a fast transient voltage measurement system, using a voltage source comprising a high voltage DC power supply, a discharging gap, a high voltage conductor and an earthing conductor, wherein
   the high voltage conductor and the earthing conductor are high voltage insulated from each other and form a traveling wave line with constant wave impedance;
   the high voltage DC power supply is connected between the ends of the high voltage conductor and the earthing conductor, for charging DC high voltage between the high voltage conductor and the earthing conductor;
   the discharging gap is connected between the ends of the high voltage conductor and the earthing conductor; the discharging gap is broken down when the DC voltage between the high voltage conductor and the earthing conductor is risen to a certain amplitude;
   the method comprising:
      a charging step, including:
         starting the DC high voltage power supply to charge DC high voltage between the high voltage conductor and the earthing conductor;
      a breaking down step, including:
         increasing the charging voltage between the high voltage conductor and the earthing conductor to a certain amplitude so that the discharging gap connected at the end of the high voltage conductor is broken down; and after the discharging gap being broken down, producing a very fast transient high voltage on the high voltage conductor, wherein the very fast transient high voltage is used as the calibration voltage.

2. The method as claimed in claim 1, wherein the method of calibrating the measurement system, after production of the calibration voltage, comprising:
   measuring the charging voltage between the high voltage conductor and the earthing conductor connected with the discharging gap;
   recording the voltage at which the discharging gap being broken down;
   selecting a measurement point on the high voltage conductor, wherein the measurement point can be selected at the end of the high voltage conductor opposite to the discharging gap, where the very fast transient high voltage has a waveform theoretically of a series of squares and the amplitude of the squares as large as double of the breakdown voltage of the discharging gap;
   measuring the voltage waveform of the measurement point by the measurement system to be calibrated; reading out the front rising time and the voltage amplitude of the first square wave; and
   calibrating the measurement system according to a measurement result.

3. The method as claimed in claim 2, wherein the calibration of the measurement system according to the measurement result further comprising:
- calibrating the frequency response characteristic of the measurement system, and calibrating the voltage dividing ratio of the measurement system;
- wherein the front rising time reading out from the first step measured is calibrated as the rising time of step response which the measurement system at least reaches;
- double of the measured breakdown voltage of the discharging gap is the practical amplitude of the square wave voltage appeared at the measurement point, the ratio of the practical amplitude of the square wave voltage to the measured amplitude of the square wave is calibrated as the voltage dividing ratio of the measurement system.

* * * * *